United States Patent
Kim et al.

(10) Patent No.: US 7,663,924 B2
(45) Date of Patent: Feb. 16, 2010

(54) NON-VOLATILE MEMORY DEVICES HAVING MULTI-PAGE PROGRAMMING CAPABILITIES AND RELATED METHODS OF OPERATING SUCH DEVICES

(75) Inventors: Jin-Kook Kim, Seoul (KR); Seong-Kue Jo, Gyeonggi-do (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 11/942,331

(22) Filed: Nov. 19, 2007

(65) Prior Publication Data

US 2008/0068888 A1 Mar. 20, 2008

Related U.S. Application Data

(63) Continuation of application No. 10/941,799, filed on Sep. 15, 2004, now Pat. No. 7,317,654.

(30) Foreign Application Priority Data

Jul. 13, 2004 (KR) .............................. 2004-54457

(51) Int. Cl.
*G11C 11/34* (2006.01)
(52) U.S. Cl. .................... 365/185.18; 365/185.05; 365/230.03
(58) Field of Classification Search ............ 365/230.06, 365/189.05, 230.08, 238.5, 230.03, 185.18, 365/185.5
See application file for complete search history.

(56) References Cited

U.S. PATENT DOCUMENTS

| | | | | |
|---|---|---|---|---|
| 5,299,162 A | | 3/1994 | Kim et al. | ............... 365/185.17 |
| 5,473,563 A | | 12/1995 | Suh et al. | ............... 365/185.13 |
| 5,602,778 A | * | 2/1997 | Futatsuya et al. | ....... 365/185.09 |
| 5,625,590 A | * | 4/1997 | Choi et al. | ............. 365/185.17 |
| 5,696,717 A | | 12/1997 | Koh | ...................... 365/185.22 |
| 5,890,195 A | * | 3/1999 | Rao | .......................... 711/105 |
| 6,091,666 A | | 7/2000 | Arase et al. | ............... 365/238.5 |
| 6,331,956 B1 | | 12/2001 | Ooishi et al. | ................. 365/200 |
| 6,556,504 B2 | * | 4/2003 | Kwon et al. | ........... 365/230.08 |
| 6,600,676 B2 | * | 7/2003 | Shibata et al. | ......... 365/185.04 |
| 7,317,654 B2 | * | 1/2008 | Kim et al. | .............. 365/230.06 |

(Continued)

FOREIGN PATENT DOCUMENTS

JP 10040691 A 2/1998

(Continued)

OTHER PUBLICATIONS

German Office Action (3 pages) corresponding to German Patent Application 10 2005 033 165.3-55; Mailing Date: Oct. 1, 2008.

*Primary Examiner*—Son Dinh
(74) *Attorney, Agent, or Firm*—Myers Bigel Sibley & Sajovec

(57) ABSTRACT

Methods of programming a non-volatile memory device having at least one memory block with a plurality of memory cells located at intersections of rows and columns is disclosed. Pursuant to these methods, at least two addresses that select corresponding rows of the memory block may be received and temporarily stored. Then, the rows selected by the temporarily stored addresses may be simultaneously activated, and at least some of the memory cells in the activated rows are simultaneously programmed. Corresponding non-volatile memory devices are also provided.

10 Claims, 6 Drawing Sheets

U.S. PATENT DOCUMENTS

| | | | |
|---|---|---|---|
| 2003/0016573 A1 | 1/2003 | Mori et al. | 365/200 |
| 2003/0189860 A1 | 10/2003 | Takeuchi et al. | 365/200 |
| 2004/0090847 A1 | 5/2004 | Takeuchi et al. | 365/200 |
| 2005/0286301 A1 | 12/2005 | Mochizuki | 365/185.17 |

FOREIGN PATENT DOCUMENTS

| | | |
|---|---|---|
| JP | 2003-196989 | 7/2003 |
| KR | 2001-0100782 | 11/2001 |

\* cited by examiner

NON-VOLATILE MEMORY DEVICES HAVING MULTI-PAGE PROGRAMMING CAPABILITIES AND RELATED METHODS OF OPERATING SUCH DEVICES

RELATED APPLICATION

This application claims priority under 35 U.S.C. §120 as a continuation application of U.S. patent application Ser. No. 10/941,799, filed Sep. 15, 2004, now U.S. Pat. No. 7,317,654, which in turn claims priority under 35 U.S.C. §119 From Korean Patent Application No. 2004-54457, filed on Jul. 13, 2004. The entire contents of the above-referenced applications are hereby incorporated herein by reference as if set forth in their entireties.

FIELD OF THE INVENTION

The present invention relates to semiconductor memory devices and, more particularly, to non-volatile memory devices such as flash memory devices.

BACKGROUND OF THE INVENTION

Semiconductor memories are a vital component of most digital logic systems. As such, advances in the fabrication of semiconductor memories that provide for higher integration densities and faster operating speeds may enhance the performance standards of many digital logic families. Semiconductor memory devices include volatile random access memories (RAMs) and non-volatile memory devices. In RAMs, data may be stored using a bistable flip-flop such as in a static random access memory (SRAM) or by charging a capacitor as in a dynamic random access memory (DRAM). IN either case, the stored data can be read out as long as power is applied to the memory device, but the data is lost when the power is turned off.

Non-volatile memories, such as, for example, MROM, PROM, EPROM and EEPROM memory devices are capable of storing data even when the power to the device is turned off. The non-volatile memory data storage mode may be permanenet or reprogrammable, depending upon the fabrication technology used. Non-volatile memories are used for program and microcode storage in a wide variety of applications in the computer, avionics, telecommunications and consumer electronics industries. A combination of single-chip volatile and non-volatile memory storage modes are also available in devices such as non-volatile SWAM (nvRAM) for use in systems that require fast, programmable non-volatile memory. In addition, dozens of special memory architectures have evolved which contain some additional logic circuitry to optimize their performance for application-specific tasks.

It typically is difficult or even impossible for general users of systems with Mesh ROM ("MROM"), Programmable ROM ("PROM") or Erasable Programmable ROM ("EPROM") memories to erase and write over information stored in the memory devices. On the other hand, Electrically Erasable Programmable ROM ("EEPROM") memory devices can be erased and new data can be stored therein. As such, EEPROM memory devices are now widely used as auxiliary memories and/or to store system programming that requires periodic updates. Flash EEPROM devices generally have a higher degree of integration than do conventional EEPROM devices, and thus flash EEPROM memory devices are often used in applications that require a large auxiliary memory. NAND-type flash EEPROM memory devices (hereinafter, referred to as "NAND-type flash memory") generally have a higher degree of integration than do NOR-type flash EEPROM memory devices.

FIG. 1 is a block diagram of the array structure of a conventional non-volatile memory device. As illustrated in FIG. 1, the memory cell array of the flash memory device includes a storage area for storing information, which may be divided into a main field 10 and a spare field 20. While the memory cell array depicted in FIG. 1 corresponds to a single memory block (or portion thereof), those of skill in the art will appreciate that typically the memory cell array will include many memory blocks. The spare field 20 may be used to store information related to the main field 10 as well as information such as error correction codes, device codes, other codes, page information and the like. Each of the main and spare fields 10 and 20 in the memory cell array includes a plurality of cell strings 1 (which are sometimes referred to as NAND strings) as illustrated in FIG. 1. A page buffer circuit (not illustrated in FIG. 1) is provided in the flash memory device to store data in and read data out of the memory cell array. As is well known in the art, memory cells of a NAND-type flash memory device may be programmed and erased using Fowler-Nordheim ("F-N") tunneling current as disclosed, for example, in U.S. Pat. No. 5,473,563 entitled "NONVOLATILE SEMICONDUCTOR MEMORY" and U.S. Pat. No. 5,696,717 entitled "NONVOLATILE INTEGRATED CIRCUIT MEMORY DEVICES HAVING ADJUSTABLE ERASE/PROGRAM THRESHOLD VOLTAGE VERIFICATION CAPABILITY", the disclosures of which are incorporated herein by reference as if set forth in their entirety.

In order to store data in the main field 10, a data loading command is applied to the flash memory device, and addresses and data are successively provided to the flash memory device. In general, data that is to be stored in the device is sequentially transferred to the page buffer circuit in a byte or word unit. Once a page of data is loaded into the page buffer circuit, the data is programmed into the memory cell array (that is, memory cells of the selected page) in response to a program command.

After the memory cells of a selected page are programmed, information indicating whether the memory cells of the selected page were programmed normally may be stored in a specific region (e.g., a spare field) of the memory cell array. Such information is often referred to as "page information" or as a "confirm mark." The page information corresponding to pages WL0-WLm may, for example, be stored in a specific string of the spare field 20. For example, the page information corresponding to a first page WL0 may be stored in a memory cell M0' of a string that is connected to spare bit line SBL0, the page information corresponding to a second page WL1 may be stored in a memory cell M1' of the string that is connected to spare bit line SBL0, and the page information corresponding to the last page WLm may be stored in a memory cell Mm' of the string that is connected to the spare bit line SBL0.

As should be clear from the above description, two program operations are required to store a pace data. Thus, if a memory cell array has 32 pages (or word lines), 64 program operations are required to store all 32 pages of data.

SUMMARY OF THE INVENTION

Pursuant to embodiments of the present invention, methods of programming memory devices having at least one memory block are provided. Pursuant to these methods, at least two addresses that select corresponding rows of the memory block may be received and temporarily stored. Then, the rows selected by the temporarily stored addresses may be simultaneously activated, and at least some of the memory cells in the activated rows are simultaneously programmed.

The memory device may, for example, be a NAND-type flash non-volatile memory device. The at least one memory block may be divided into a main field and a spare field. The memory cells that are simultaneously programmed may be the memory cells located at the intersections of the first columns of the spare field and the activated rows. Each memory cell may be programmed with information related to a corresponding row in tie main field of the memory block In embodiments of the present invention, the at least two received addresses may be temporarily stored by latching the at least two received addresses. Moreover, additional addresses may be received and stored such that all of the rows are simultaneously activated.

Pursuant to further embodiments of the present invention, methods of programming a non-volatile memory device which has at least one memory block that is made up of a plurality of memory cells at the intersections of rows and columns are disclosed in which a first address that selects a first row of the at least one memory block is received. This first address is then temporarily stored in a corresponding one of a plurality of latches of a row decoder circuit, the latches of the row decoder circuit corresponding to respective of the rows of the memory block. A second address that selects a second row of the at least one memory block is then received and temporarily stored in a corresponding one of the plurality of latches of the row decoder circuit. Thereafter, the rows that correspond to the temporarily stored first and second received addresses are simultaneously activated, and the memory cells that are connected to the activated rows that are disposed in at least some of the columns of a spare field of the memory block are simultaneously programmed.

In these embodiments, the columns of the spare field may correspond to respective of the rows of the at least one memory block. The programmed memory cells in each of the first columns may store information related to a corresponding row. The methods may further include receiving and temporarily storing additional addresses that select additional rows of the at least one memory block. In such embodiments, the rows that correspond to all of the temporarily received addresses may be simultaneously activated.

Pursuant to still further embodiments of the present invention, non-volatile memory devices are provided which have a memory block having a plurality of word lines and a plurality of bit lines and a row decoder circuit that is configured to select one or more of the word lines in response to at least one row address. In these devices, the row decoder circuit may include latches that correspond to each of the word lines and the row decoder may be configured to latch a specific row address in order to select a corresponding word line.

In these devices, when the word lines of latched row addresses are activated at the same time, the same data may be simultaneously programmed into memory cells that are connected to the activated word lines and are disposed in each of bit lines of a spare field. The bit lines of the spare field may correspond to respective of the word lines of the memory block. The programmed memory cells in the spare field may store information indicating whether the memory cells of a corresponding row in a main field are normally programmed.

The device may also include a control logic circuit that is configured to control the row decoder circuit so that word lines of latched row addresses are activated at the same time in a multi-page program operation. The control logic may control the row decoder circuit so that the row addresses of word lines that are to be selected are stored in the corresponding latches during multi-page program operation. The control logic may first initialize the latches in the row decoder circuit when a multi-page select command is received during the multi-page program operation of the device. The control logic may also control the row decoder circuit so that a word line is selected without storing a row address during single-page program operation of the device.

Pursuant to still further embodiments of the present invention, non-volatile memory devices are provided which include a memory block having (1) a plurality of memory cells located at intersections of a plurality of word lines and a plurality of bit lines, (2) a block decoder circuit that is configured to generate a block select signal in response to block address information, (3) a page decoder circuit having a plurality of word line select signal circuits that are configured to generate word line select signals for respective of the plurality of word lines in response to page address information and (4) a switch circuit that is configured to transfer the word line select signals to corresponding word lines in response to the block select signal. In these devices, the word line select signal circuits include latches that are configured to latch page address information that selects a corresponding word line during multi-page program operation. The device may further include a control logic circuit that is configured to control the page decoder circuit so that word lines of latched page addresses are activated at the same time during multi-page program operation.

These devices may be configured to simultaneously activate the word lines corresponding to latches where page address information is stored during the multi-page program operation. In these devices, when the word lines of latched page addresses are activated at the same time, the same data is simultaneously programmed in memory cells located at the intersections of the activated word lines at least one of the bit lines in a spare field of the memory block. The data programmed into the memory cells in the spare field may indicate whether the memory cells of a corresponding row in a main field are normally programmed. The bit lines of the spare field may correspond to respective of the word lines of the at least one memory block.

Pursuant to further embodiments of the present invention, methods of writing information to a spare field of memory cells that are part of a memory block of a non-volatile memory device are provided. Pursuant to these methods, a first address that selects a first row of the memory block is received. A first indicator that indicates that the first row of the memory block has been selected is then stored. A second address that selects a second row of the memory block may then be received, and a second indicator that indicates that the second row of the memory block has been selected is stored. The first and second rows of the memory block may then be activated simultaneously, and information may be simultaneously written to at least some of the memory cells in the first and second rows of the spare field.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying, drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It also will be understood that, as used herein, the terms "row" and "column" indicate two non-parallel directions that may be orthogonal to one another. However, the terms row and column do not indicate a particular horizontal or vertical orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
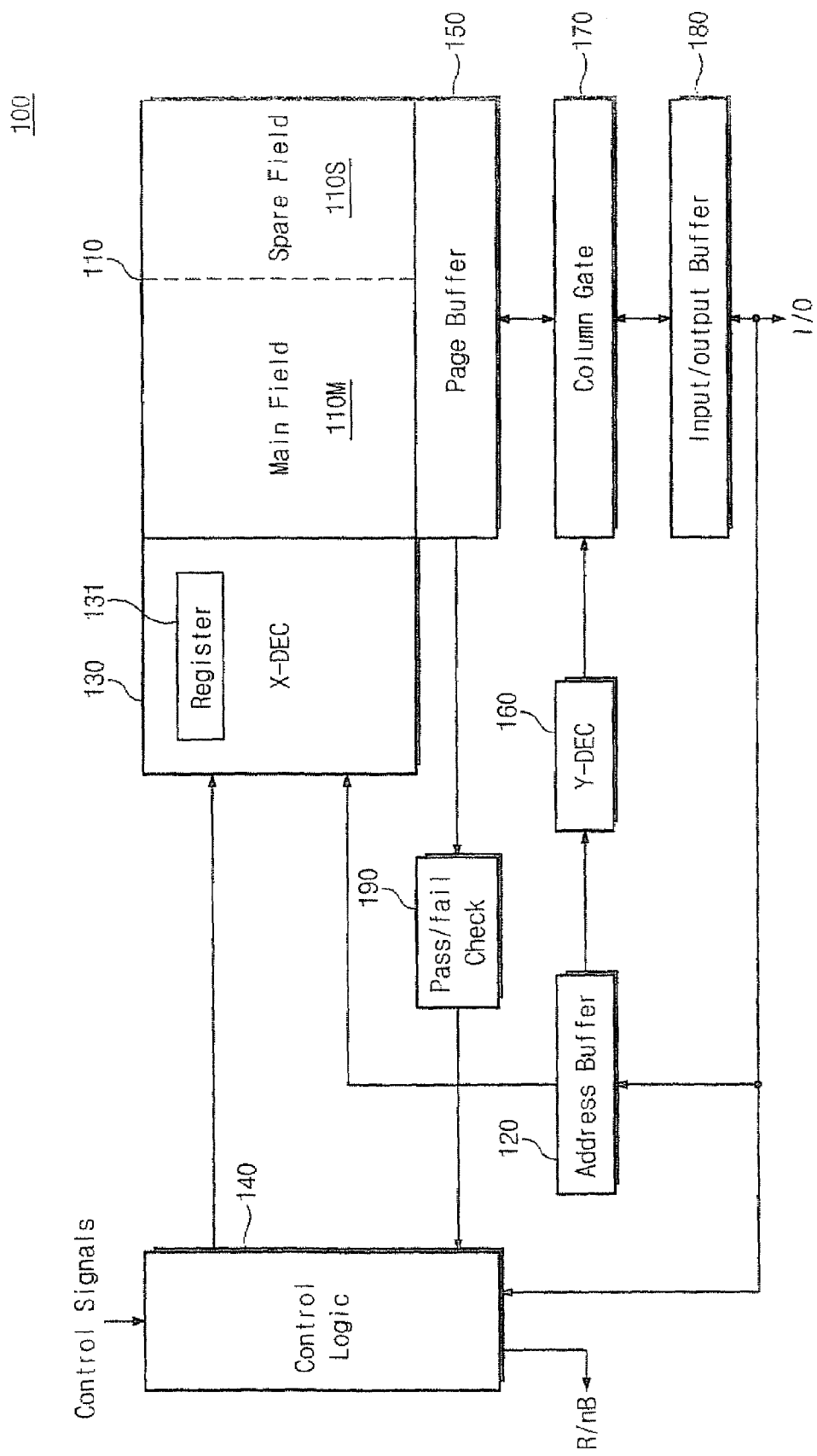
FIG. 2 is a schematic block diagram of a non-volatile memory device according to certain embodiments of the present invention.

FIG. 2 is a schematic block diagram of a NAND-type flash memory device according to certain embodiments of the present invention. It will be appreciated by those of skill in the art, however, that the present invention is not limited to NAND-type flash memory devices, but instead may be applied to other semiconductor memory devices such as MROM, PROM, FRAM, NOR-type flash memory devices and the like.

Figure 1:
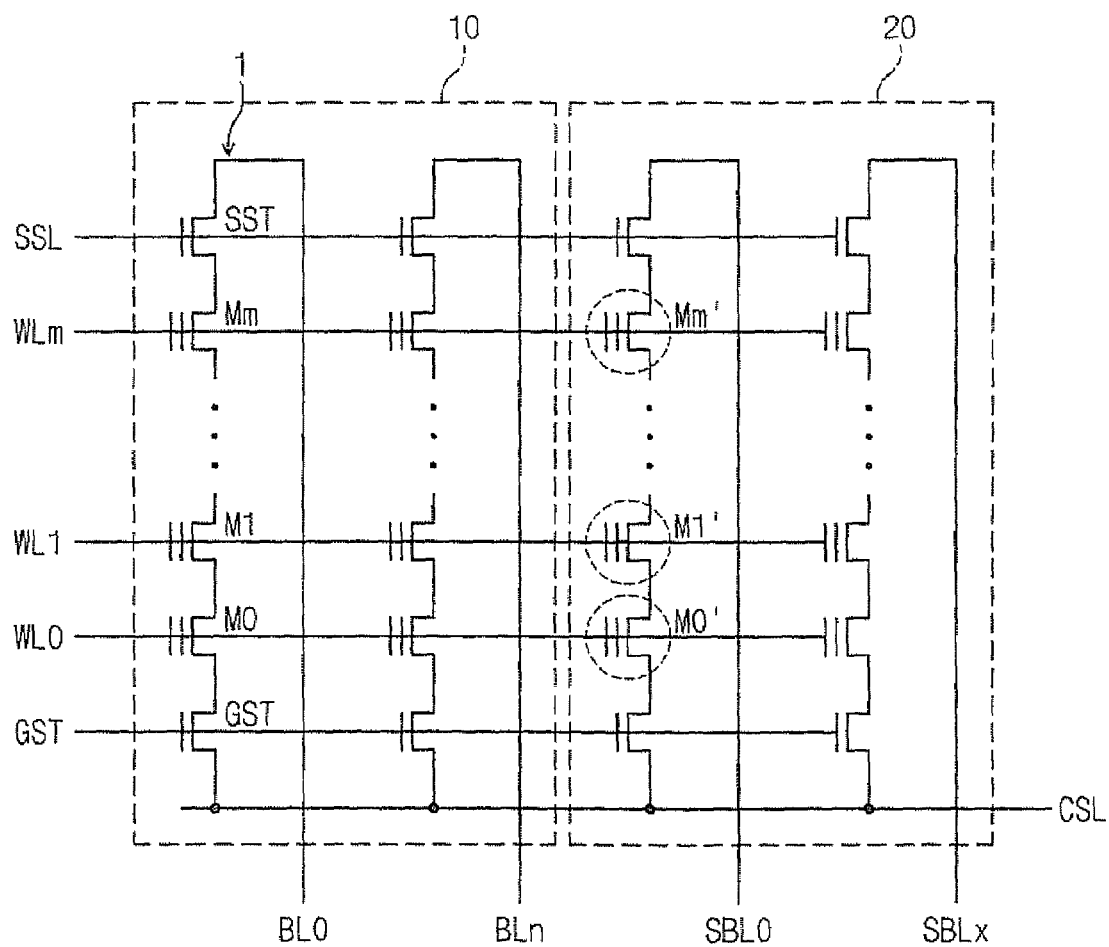
FIG. 1 is a circuit diagram of the array structure of a conventional non-volatile memory device.

As shown in FIG. 2, the non-volatile memory device 100 includes a memory cell array 110 for storing data. Tie memory cell array 110 may comprise a plurality of memory blocks. Each of the memory blocks is divided into a main field 110M and a spare field 110S. The main and spare fields 110M and 110S of each memory block may be configured as illustrated in FIG. 1, and thus description of these fields will not be repeated here. The non-volatile memory device 100 of FIG. 2 further includes an address buffer circuit 120, a row decoder circuit 130 (X-DEC), control logic 140, a page buffer circuit 150, a column decoder circuit 160 (Y-DEC), a column gate circuit 170, an input/output buffer circuit 180, and a pass/fail check circuit 190.

The address buffer circuit 120 is controlled by the control logic 140, and receives column and row addresses via input/output pins I/Oi. The row decoder circuit 130 is also controlled by the control logic 140, and operates in response to a row address that is received from the address buffer circuit 120. The row address may comprise a block address for selecting a memory block and a page address for selecting pages (or word lines) of the selected memory block. The row decoder circuit 130 responds to the received row address and selects one of the memory blocks. The row decoder circuit 130 further drives pages of the selected memory block with word line voltages. The row decoder circuit 130 may include a register 131 which is configured to temporarily store page addresses that select two or more of pages of a memory block when the device operates in a multi-page program mode. During multi-page program mode operation, the page addresses in the register 131 may be used to simultaneously activate pages (or word lines) of a selected memory block. Such simultaneous activation of selected word lines may be accomplished, for example, by synchronously supplying a program voltage to the word lines selected by the page addresses in the register 131.

Still referring to FIG. 2, the page buffer circuit 150 includes a plurality of page buffers (not shown) that are connected to respective bit lines (which are shared by all memory blocks), and acts as a sense amplifier and a write driver according to the mode of operation. For example, during a read operation, the page buffer circuit 150 senses data from a selected memory block (e.g., main and spare fields or a spare field) via the bit lines. The page buffer circuit 150 latches data to be programmed and drives bit lines with a program voltage (e.g., a ground voltage) or a program-inhibit voltage (e.g., a power supply voltage) based on the latched data. The column decoder circuit 160 decodes a column address from the address buffer circuit 120, and the column gate circuit 170 selects page buffers of the page buffer circuit 150 in a bit organization unit in response to the decoded address signals from the column decoder circuit 160. Data read by the page buffer circuit 150 is output to an external circuit via the column gate circuit 170 and the input/output buffer circuit 180. Data that is to be programmed is transferred to the page buffer circuit 150 via the column gate circuit 170 and the input/output buffer circuit 180. The pass/fail check circuit 190 receives data bits read by the page buffer circuit 150 during a program/erase verify operation and determines whether the received data bits have the same value (that is, a pass data value). The result of the pass/fail check circuit 190 is transferred to the control logic 140.

Exemplary page buffer and pass/fail check circuits are disclosed in U.S. Pat. No. 5,299,162 entitled "NONVOLATILE SEMICONDUCTOR MEMORY DEVICE AND AN OPTIMIZING PROGRAMMING METHOD THEREOF", which is hereby incorporated by reference as if set forth herein in its entirety.

Although not shown in figures, the column decoder circuit 160 includes an address counter, which successively generates column addresses by sequentially increasing an initial column address. This means that page data to be programmed/read is sequentially transferred via the column gate circuit 170 in a bit organization unit.

Still referring to FIG. 2, the control logic 140 is configured to control a multi-page program mode where two or more of the word lines in a memory block are simultaneously activated. The control logic 140 also controls a single-page program mode %vhiere only a single word line in a memory block is activated at a time. The control logic 140 determines address, command and data input timing in response to control signals, such as CLE, ALE, /CE, /RE, and /WE. In the multi-page program mode, the control logic 140 controls the address buffer circuit 120 and the row decoder circuit 130 so that page addresses for selecting all or ones of pages in a memory block are sequentially stored in the register 131 of the row decoder circuit 130. The control logic 140 controls the row decoder circuit 130 so that the word lines corresponding to the page addresses in the register 131 are simultaneously driven (or activated). This will be described more fully below.

As described above, the non-volatile memory device 100 supports a multi-page program mode in which multiple word lines in a memory block are activated at the same time. In other words, during the multi-page program mode, all or ones of word lines in a memory block are simultaneously driven with a program voltage. In order to activate word lines simultaneously, a register 131 is provided, for example, in the row decoder circuit 130, and page addresses of the word lines that are to be selected in a memory block are temporarily stored in the register 131 under the control of the control logic 140.

Figure 3:
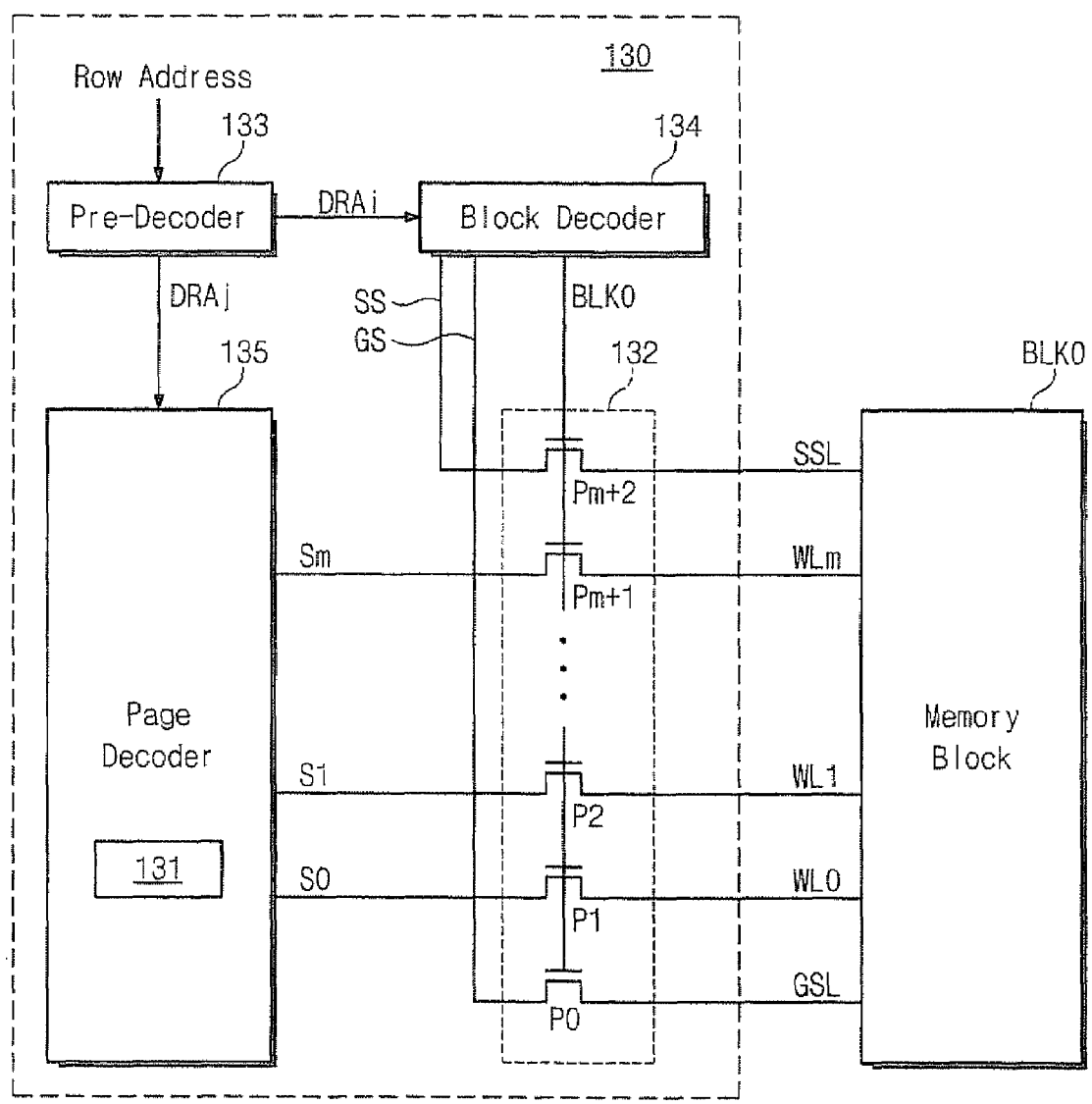
FIG. 3 is a schematic block diagram of a row decoder circuit according to certain embodiments of the present invention.

FIG. 3 is a schematic block diagram of a row decoder circuit 130 according to certain embodiments of the present invention. The row decoder circuit 130 may be used, for example, in the non-volatile memory device of FIG. 2.

As shown in FIG. 3, the row decoder circuit 130 comprises a switch circuit 132, a pre-decoder circuit 133, a block decoder circuit 134, and a page decoder circuit 135. The switch circuit 132 includes transistors P0-Pm+2 that correspond to a ground select line GSL, word lines WLm-WL0 and a string select line SSL, respectively. The string select line SSL, the word lines WLm-WL0 and the ground select line GSL are connected to select lines SS, Sm-S0 and GS via corresponding transistors P0-Pm+2. The pre-decoder circuit 133 decodes a row address from an address buffer circuit (e.g., buffer circuit 120 in FIG. 2). The decoded address comprises a block address and a page address. The block address DRAi of the decoded address is output to the block decoder circuit 134, and the page address DRAj thereof is output to the page decoder circuit 135.

The block decoder circuit 134 activates/inactivates a block select signal BLK0 in response to the block address DRAi. The transistors P0-Pm+2 are commonly controlled by the block select signal BLK0. The activated block select signal BLK0 has a sufficiently high voltage such that any high voltages on the select lines S0-Sm of the page decoder 135 are transferred to corresponding word lines WL0-WLm without a voltage drop. The block decoder circuit 134 also controls activation of the select signals SS and GS in response to the block address DRAi. The page decoder circuit 135 selects the select lines S0-Sm corresponding to word lines WL0-WLm in response to the page address DRAj from the pre-decoder circuit 133. For example, in a single-page program mode, the page decoder circuit 135 supplies a program voltage to a select line corresponding to a page address and a pass voltage to the remaining select lines. In a read mode, the page decoder circuit 135 supplies a read voltage to a select line corresponding to a page address and a pass voltage to the remaining, select lines. The page decoder circuit 135 includes a register 131 for storing page addresses so that a plurality of word lines may be simultaneously selected (or activated) in a multi-page program mode, which will be described more fully below.

Figure 4:
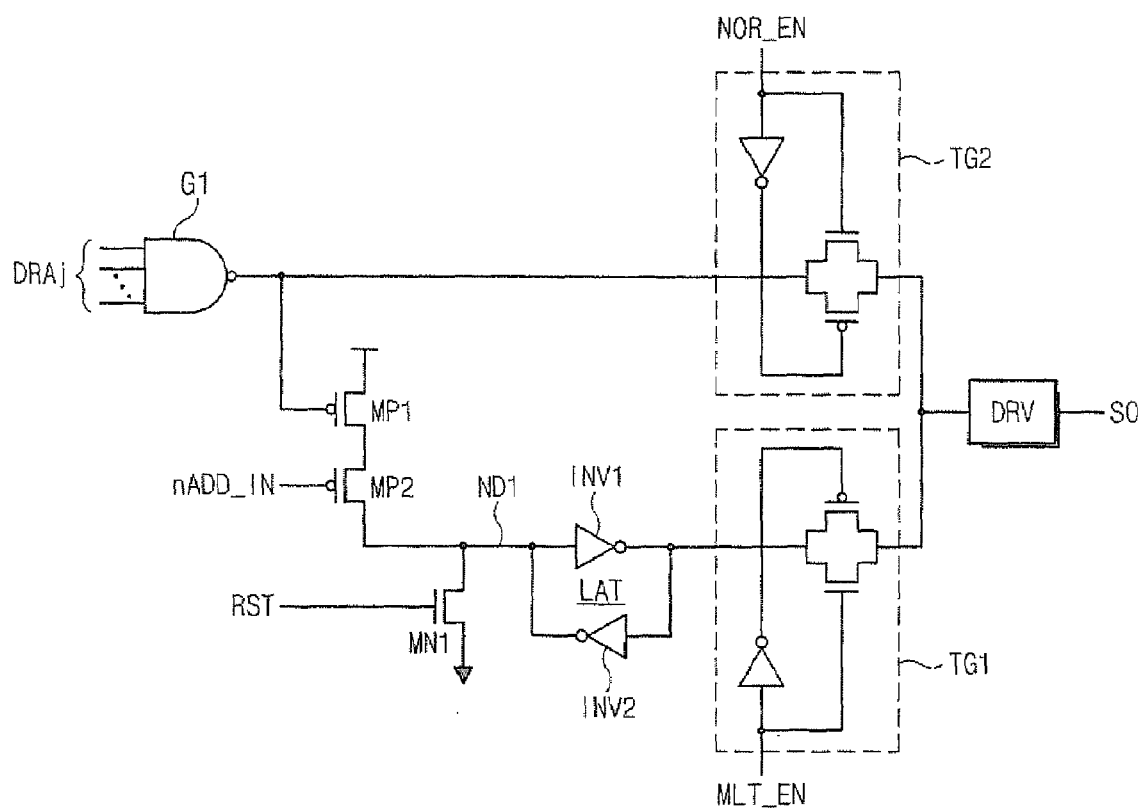
FIG. 4 is a circuit diagram of a page decoder circuit according to certain embodiments of the present invention.

FIG. 4 is a circuit diagram illustrating a page decoder circuit according to certain embodiments of the present invention which may be used, for example, as part of the page decoder circuit 135 illustrated in FIG. 3. In FIG. 4, only the portion of the page decoder circuit that implements a single select line (S0) (namely portion 135a) is illustrated. As will be understood by those of skill in the art, the portion of the page decoder circuit that implements the remaining select lines S1-Sm may be configured in a similar fashion.

The page decoder circuit 135a illustrated in FIG. 4 comprises a NAND gate G1, PMOS transistors MP1 and MP2, an NMOS transistor MN1, a latch LAT (or a register) consisting of inverters INV1 and INV2, transmission gates TG1 and TG2 and a driver DRV. The latches LAT of the page decoder circuits 135a constitute the register 131 illustrated in FIG. 2. A decoded page address DRAj from the pre-decoder circuit 133 in FIG. 3 is applied to the NAND gate G1. The PMOS transistors MP1 and MP2 are connected in series between the power supply voltage and an input node ND1 of the latch LAT. A gate of the PMOS transistor MP1 is coupled to an output terminal of the NAND gate G1, and a gate of the PMOS transistor MP2 is coupled to receive a control sisal nADD_IN. The NMOS transistor MN1 is connected between the input node ND1 of the latch LAT and the ground voltage and is controlled by a control signal RST. The transmission gate TG1 is controlled by the control signal MLT_EN and transfers an output of the latch LAT to the driver DRV. The transmission gate TG2 is controlled by a control signal NOR_EN and transfers an output of the NAND gate G1 to the driver DRV. The driver DRV drives the select line S0 in response to an input signal. For example, the select line S0 is driven with a program voltage in the multi-page program mode. The driver DRV can be realized by means of a level shifter, a switch pump or the like. An exemplary driver is disclosed in the above referenced U.S. Pat. No. 5,473,563. The control signals nADD_IN, RST, NOR_EN and MLT_EN may be generated, for example, by the control logic 140 in FIG. 2.

Figure 5:
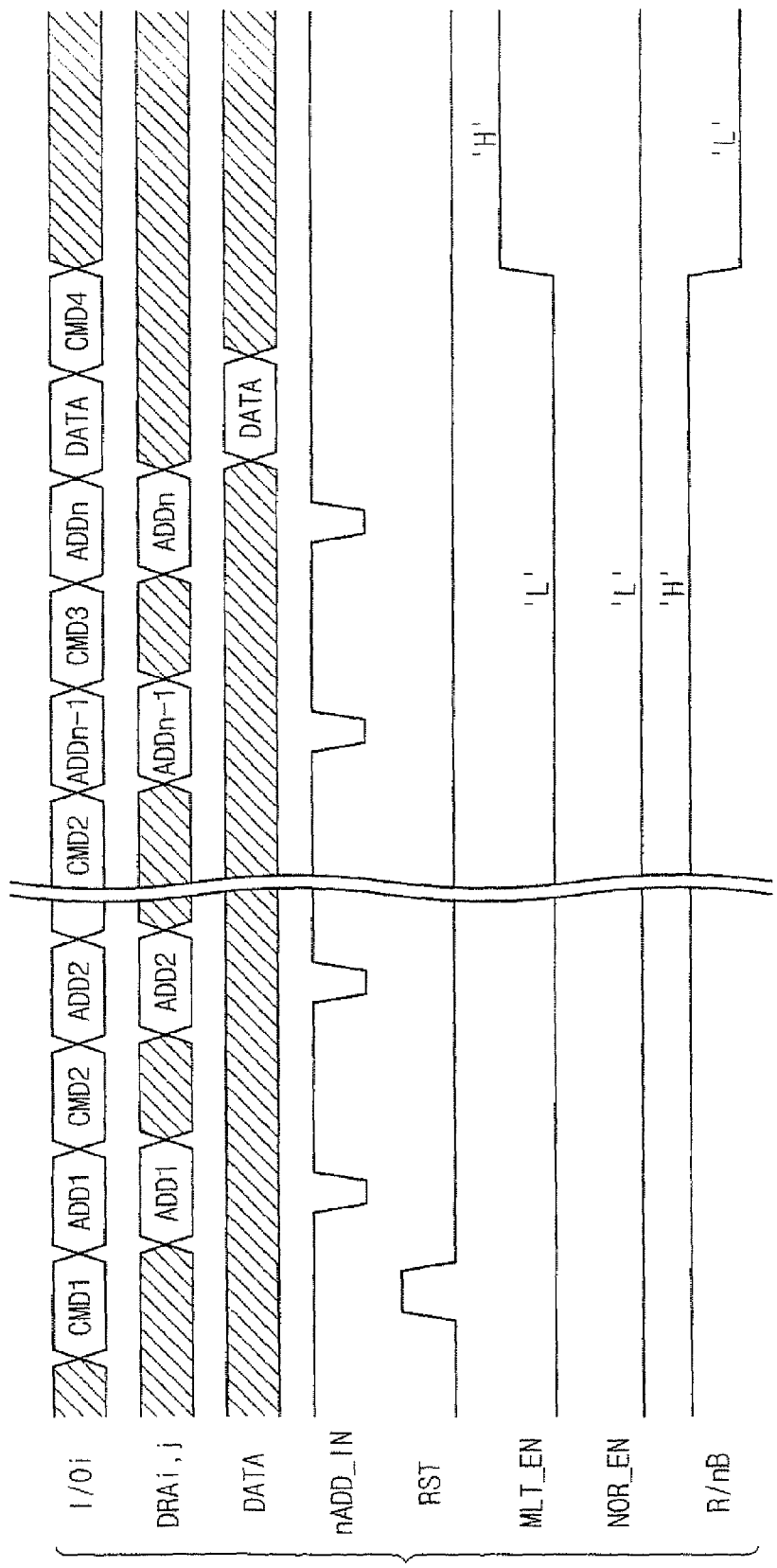
FIG. 5 is a timing diagram illustrating a multi-page program method according to certain embodiments of the present invention.

FIG. 5 is a timing diagram that illustrates a multi-page program operation of a non-volatile memory device according to certain embodiments of the present invention. Below, a multi-page program operation of the non-volatile memory device will be more fully described with reference to accompanying drawings. Information related to a main field, such as page information, is programmed in a spare field in the multi-page program mode. Unlike conventional memory devices, the present memory device simultaneously stores page information related to all pages of a memory block in a spare field. To simplify the description, the multi-page program operation will be described with respect to the single page decoder circuit 135a illustrated in FIG. 4.

If a first command CMD1 is received as a multi-page select command, the control logic 140 activates the control signal RST. The NMOS transistor MN1 in the page decoder 135a is turned on by activation of the control signal RST, so that the latch LAT is reset. At this time, control signals MLT_EN and NOR_EN are at a low level such that transmission gates TG1 and TG2 are inactivated. Thereafter, a row address ADD1 for selecting a memory block and word lines is applied to the input/output pins I/Oi. The row address ADD1 may comprise a page address for selecting a page (or a word line) and a block address for selecting a memory block. The received row address may be decoded by the pre-decoder circuit 133, and the decoded block address DRAi is transferred to a block decoder circuit 134. On or about the same time, the decoded page address DRAj may be provided to the NAND gate G1 of the page decoder 135a.

As illustrated in FIG. 5, when a row address is received, the control logic 140 activates the control signal nADD_IN. If the decoded page address signals are all "high", the output of the NAND gate G1 goes "low" and the PMOS transistor MP1 is turned on. Accordingly, when the control signal nADD_IN is activated, the input node ND1 of the latch LAT has a low-to-high transition. At this time, since the transmission gates TG1 and TG2 are inactivated, the select line S0 is not driven by the driver DRV.

If a row address follows the first command CMD1 as a multi-page select command, a page address of a received row address is stored in the latch LAT of the page decoder 135a according to the control of the control logic 140. This operation is repeated until page addresses of pages (or word lines) to be selected are all stored in corresponding page decoders.

As illustrated in FIG. 5, in order to store a page address in a page decoder circuit 135 after an input of the first command CMD1, a second command CMD2 is received. The second command CMD2 is a command that indicates that addresses are to be successively received. The first command CMD1 can be used instead of the second command CMD2. In response to receiving a third command CMD3 (which indicates that input of addresses and data is complete), data to be programmed is loaded onto the page buffer circuit 150 via the input/output buffer circuit 180 and the column gate circuit 170. An address following the third command CMD3 comprises a row address and a column address. The column address is used to select columns of a spare field. That is, data to be programmed is loaded onto page buffers of the page buffer circuit 150 corresponding to the spare field.

In embodiments of the present invention, the data to be programmed is page information that pages (word lines) of a memory block have been programmed. Accordingly, the data to be programmed may all have the same data value. The number of spare bit lines of the spare field selected in the multi-page program mode may be identical to the number of word lines of the memory block. Further, it will be understood that the data to be programmed is not limited to page information indicating whether pages (word lines) of a memory block are programmed, but may extend to any other type of data that is stored in the spare field.

Once page addresses of the word lines that are to be selected are all stored in the corresponding page decoders, the control logic 140 activates the control signal MLT_EN as a multi-page program command in response to a fourth command CMD4. As the control signal MLT_EN is activated, the value stored in the latch LAT is transferred to the driver DRV through the transmission gate TG1. In response to this input signal, the driver DRV drives the select line S0 with a program voltage. In other words, the select lines that correspond to the page decoders where page addresses are stored are simultaneously driven with a program voltage, while the select lines corresponding to the page decoders where no page addresses are stored are driven with a pass voltage.

Select signals (e.g., S0 and S1) having the program voltage and select signals (e.g., S2-Sm) having the pass voltage are transferred to their corresponding word lines WL0-WLm via the switch circuit 132. At the same time, spare bit lines are supplied with a program voltage (e.g., a ground voltage) or a program-inhibit voltage (e.g., a power supply voltage) according to data values loaded onto corresponding page buffers of the spare field. Thereafter, memory cells which are arranged at intersections of activated word lines (each having the program voltage) and the spare bit lines are simultaneously programmed. During a program time, an R/nB signal is set to a low level.

Figure 6:
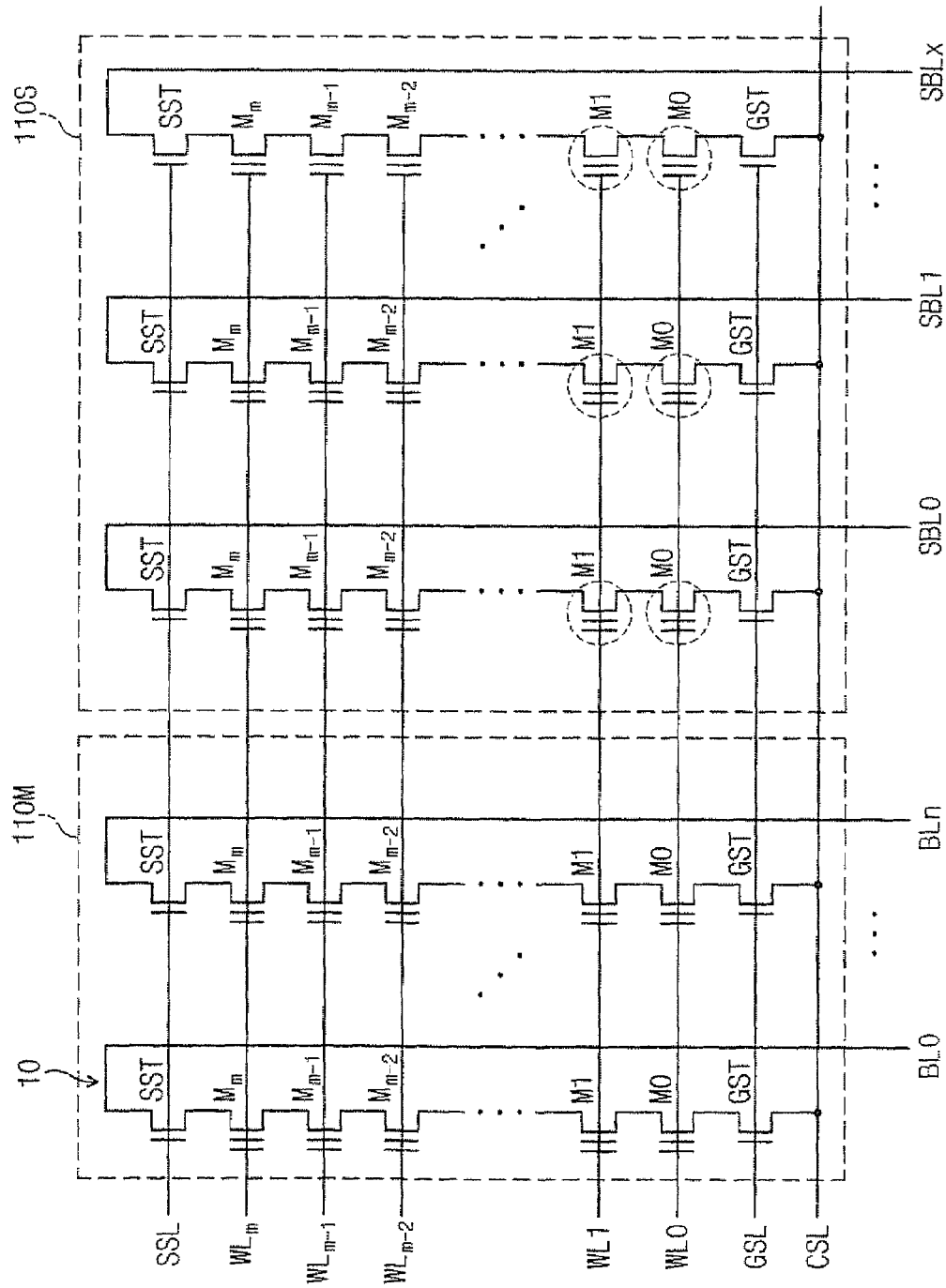
FIG. 6 is a circuit diagram of a spare field programmed using a multi-page program method according to certain embodiments of the present invention.

For example, assume that two word lines WL0 and WL1 are simultaneously selected, and that the spare bit lines SBL0-SBLx corresponding to word lines WL0-WLm of a memory block are selected. According to this assumption, as illustrated in FIG. 6, the same data is programmed in memory cells M0 and M1 that are arranged at intersections of activated word lines WL0 and WL1 and spare bit lines SBL0-SBLx (or that are connected to spare bit lines SBL0-SBLx). Alternatively, the same data may be programmed in memory cells M0 and M1 that are located at the intersections of the activated word lines WL0 and WL1 and the spare bit lines SBL0 and SBL1, while the memory cells M0 and M1 that are located at the intersections of the activated word lines WL0 and WL1 and the remaining spare bit lines SBL2-SBLx are program-inhibited. In other words, 1-bit data is stored in a string and is programmed equally in two memory cells M0 and M1. Therefore, data reliability can be improved. For 32 pages to be programmed, a program operation is repeated 33 times. This reduction in the number of program operations as compared to conventional non-volatile memory devices can improve the operating speed of the device.

In the above-described embodiments of the present invention, data that is to be stored in the spare field is loaded onto the page buffer circuit during the interval where the last row address is received. It will be appreciated, however, that data to be stored in the spare field may be loaded onto the page buffer circuit whenever an address is received. In this case, the third command CMD3 is used instead of the second command CMD2, and addresses and data is received following the third command CMD3. At this time, the received addresses comprise column and row addresses. The row address is used to select a page and a memory block, and the column address is used to select columns of a spare field.

As noted above, in the conventional programming method described above with respect to FIG. 1, data values stored in memory cells of a string connected to a spare bit line SBL0 are read out by repeating a read operation by a page number. This may reduce the performance (or operating speed) of the memory device. On the other hand, page information of a spare field programmed according to the multi-page program methods of certain embodiments of the present invention is read out at once. That is, the page information are read out from the spare field by storing page addresses in the above-described way and simultaneously activating word lines corresponding to the stored page addresses.

As discussed above, pursuant to embodiments of the present invention, addresses are received that select rows of the memory block. When the non-volatile memory devices of embodiments of the present invention operate in multi-page program mode, these received addresses may be temporarily stored to facilitate simultaneous activation of each selected row. It will be appreciated by those of skill in the art that a number of different mechanisms may be used to temporarily store these received addresses. In embodiments of the present invention, the actual received address may be stored. In other embodiments, however, data that indicates a certain address may be stored. For example, a bit in a register position that corresponds to a particular received address may be set to "temporarily store" the received address. Thus, it will be appreciated that references to "storing" a received address refer to situations where the actual address is stored as well as to situations in which data is stored that identifies and/or corresponds to the received address.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of programming a non-volatile memory device which comprises at least one memory block having a plurality of memory cells, the method comprising:
    receiving a first address that selects a first page of the at least one memory block;
    receiving a first data to be stored at the first page;
    receiving a second address that selects a second page of the at least one memory block;
    receiving a second data to be stored at the second page; and
    simultaneously activating a plurality of rows to simultaneously program the first page with the first data and the second page with the second data.

2. The method of claim 1, wherein the at least one memory block is divided into a main field and a spare field.

3. The method of claim 1, wherein each of selected pages of the at least one memory block is supplied with a program voltage and each of unselected pages of the at least one memory block is supplied with a pass voltage.

4. The method of claim 1, wherein the memory device comprises a NAND-type flash memory device.

5. A method of programming a non-volatile memory device which comprises at least one memory block having a plurality of memory cells, the method comprising:
    receiving a first address that selects a first page of the at least one memory block;
    receiving a second address that selects a second page of the at least one memory block;
    receiving a first data to be stored at the first page and a second data to be stored at the second page; and
    simultaneously activating a plurality of rows to simultaneously programming program the first page with the first data and the second page with the second data.

6. The method of claim 5, wherein the at least one memory block is divided into a main field and a spare field.

7. The method of claim 5, wherein each of selected pages of the at least one memory block is supplied with a program voltage and each of unselected pages of the at least one memory block is supplied with a pass voltage.

8. The method of claim 5, wherein the memory device comprises a NAND-type flash memory device.

9. The method of claim 1, wherein simultaneously activating the plurality of rows to simultaneously program the first page with the first data and the second page with the second data comprises synchronously supplying a program voltage to the plurality of rows.

10. The method of claim 5, wherein simultaneously activating the plurality of rows to simultaneously program the first page with the first data and the second page with the second data comprises synchronously supplying a program voltage to the plurality of rows.

* * * * *